US007317605B2

(12) United States Patent
Donze et al.

(10) Patent No.: US 7,317,605 B2
(45) Date of Patent: Jan. 8, 2008

(54) METHOD AND APPARATUS FOR IMPROVING PERFORMANCE MARGIN IN LOGIC PATHS

(75) Inventors: Richard Lee Donze, Rochester, MN (US); William Paul Hovis, Rochester, MN (US); Terrance Wayne Kueper, Rochester, MN (US); John Edward Sheets, II, Zumbrota, MN (US); Jon Robert Tetzloff, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 582 days.

(21) Appl. No.: 10/798,911

(22) Filed: Mar. 11, 2004

(65) Prior Publication Data
US 2005/0201188 A1   Sep. 15, 2005

(51) Int. Cl.
*H02H 5/04*   (2006.01)
(52) U.S. Cl. ..................................... 361/103
(58) Field of Classification Search ................ 361/103, 361/18, 93.8, 140; 702/132; 713/300
See application file for complete search history.

(56) References Cited

U.S. PATENT DOCUMENTS

| 5,940,785 | A | * | 8/1999 | Georgiou et al. | ........... 702/132 |
| 6,112,164 | A | * | 8/2000 | Hobson | ........... 702/132 |
| 6,233,190 | B1 | * | 5/2001 | Cooper et al. | ........... 365/212 |
| 6,415,388 | B1 | * | 7/2002 | Browning et al. | .......... 713/322 |
| 6,630,754 | B1 | * | 10/2003 | Pippin | ........... 307/117 |
| 6,928,559 | B1 | * | 8/2005 | Beard | ........... 713/300 |
| 2004/0003301 | A1 | * | 1/2004 | Nguyen | ........... 713/300 |

OTHER PUBLICATIONS

Temperature Sensor and System Monitor in a 10-Pin microMAX. MAXIM. Oct. 2001.*

* cited by examiner

*Primary Examiner*—Michael Sherry
*Assistant Examiner*—Chrisotpher J Clark
(74) *Attorney, Agent, or Firm*—Robert R. Williams (57) ABSTRACT

An apparatus and method is disclosed for improving timing margins of logic paths on a semiconductor chip. Typical logic embodiments, such as CMOS (Complementary Metal Oxide Semiconductor), have path delays that become shorter as supply voltage is increased. Embodiments of the present invention store product data on each particular chip. The product data includes, for examples, but not limited to, a voltage range having a low limit voltage and a high limit voltage, a limit temperature, and performance of the particular chip in storage for the particular chip. Each chip has a voltage controller, a timer, and a thermal monitor. The voltage controller communicates with a voltage regulator and dynamically causes a voltage supply coupled to the chip to be as high as possible in the voltage range, subject to the limit temperature.

8 Claims, 8 Drawing Sheets

METHOD AND APPARATUS FOR IMPROVING PERFORMANCE MARGIN IN LOGIC PATHS

BACKGROUND OF THE INVENTION

1. Field of the Invention

The current invention generally relates to logic on semiconductor chips. More specifically the current invention is directed to increasing performance margin of logic paths on the chips, consistent with environmental conditions.

2. Description of the Related Art

Semiconductor chips comprising logic circuits arranged in logic paths that perform useful functions are well known. For example, modern computer processors are built with one or more semiconductor chips with logic circuits arranged in such a way as to perform addition, shifting, rotating, comparing and many other functions needed to perform the operation of the computer processor. Storage used by the modern computer processors comprise dynamic random access memory (DRAM) and static random access memory (SRAM) that are also built on semiconductor chips.

Complementary Metal Oxide Semiconductor (CMOS) logic circuitry is the predominant semiconductor technology used in modern electronic systems, including computer systems. Logic paths in a semiconductor chip using CMOS logic circuitry have delays that are dependent on a number of factors. Process variations, such as FET (field effect transistor) channel length are a major contributor to delays of individual logic blocks, such as NANDs and NORs, which contribute to delays of logic paths. For example, a chip processed such that FET channel lengths are at the short end of the process variation will have path delays that are less than path delays on chips of the same design, but processed such that FET channel lengths are at the long end of the process variation. Carrier mobility, interconnection wiring, implant doping, and many other characteristics of the FETs and interconnect all have process variations that affect delay of individual logic blocks, and, ultimately, path delays. The process variations in delay cited above remain substantially constant for the life of a particular semiconductor chip.

External conditions also affect delays of individual logic blocks and path delays. Typically, CMOS circuits become slower, that is, have longer delays, as temperature increases. For example, in an exemplary CMOS technology, delay increases 0.2% for each degree Centigrade that temperature increases. Supply voltage has a major effect on delays. For example, in the exemplary CMOS technology, a 1% increase in the supply voltage causes a 0.6% decrease in delays of the logic circuits. Power and supply voltage on CMOS chips are interrelated; that is, as supply voltage increases, power also increases. Power is dissipated in two ways, called static power and dynamic power. Static power in CMOS circuits is primarily due to leakage currents.

In older, lower performance CMOS processes, static power was very low, and often negligible. FET channel lengths were relatively long, limiting leakage from FET drains to the corresponding FET sources. FET threshold voltages were high enough to make subthreshold currents negligible in most applications. FET gate oxide thicknesses were relatively thick, limiting leakage from the FET gate to the FET body, the FET source, and the FET drain to extremely small values.

In modern, high-performance CMOS processes, channel lengths have become very small, allowing some drain to source leakage. FET threshold voltages have been reduced to the point where subthreshold currents are no longer negligible in many applications. Gate oxide thicknesses have become only a few atomic layers thick; leakage through such a thin FET gate oxide to underlying regions results in a significant fraction of a total power dissipated by the chip. Dynamic power is dissipated as capacitances are charged and discharged during normal operation of the chip, as well as "shoot-through" current that occurs during a transition from a low to a high or a high to a low, when both a PFET (P-channel FET) and an NFET (N-channel FET) are partially conducting. Path delays therefore can be reduced by raising the supply voltage; however, raising supply voltage raises temperature on the chip.

A method and apparatus is needed to improve performance margin by dynamically adjusting the voltage supply to be as high as possible within a voltage range without causing the semiconductor chip to operate at an unacceptable temperature.

SUMMARY OF THE INVENTION

The current invention teaches methods and apparatus to improve delay margins of logic paths on a semiconductor chip by dynamically controlling a supply voltage value to be as high as possible within a voltage range for the chip and without causing the chip to operate at a temperature in excess of a limit temperature chosen by a designer.

In an exemplary embodiment, a regulated unit comprises a semiconductor chip and a voltage regulator. A voltage controller on the semiconductor chip generates a control signal which is coupled to the voltage regulator. The voltage regulator supplies a voltage value to the semiconductor chip responsive to the control signal. The voltage controller dynamically adjusts the control signal to cause the voltage regulator to reduce the voltage value if a thermal sensor coupled to the voltage controller detects that a temperature on the semiconductor chip has exceeded a limit temperature, the limit temperature specified by a designer. The voltage controller dynamically adjusts the control signal to cause the voltage regulator to increase the voltage value if, after a predetermined time interval elapses, the thermal sensor has not detected that the temperature on the semiconductor chip has exceeded the limit temperature. The designer will specify voltage range having a high limit voltage and a low limit voltage. Sometimes, the low limit voltage is determined by performance characteristics of a particular chip; e.g., if the particular chip is known to be "slow" based on performance screen ring oscillator testing, that particular chip may have a slightly higher low voltage limit than a "fast" chip in order to operate reliably at a particular frequency. The high limit voltage is advantageously chosen to be at or near a maximum allowable voltage above which degradation or damage to the chip would occur. However, any suitable choices for the high limit voltage and the low limit voltage are contemplated. Typical logic paths on semiconductor chips, in particular, CMOS (Complementary Metal Oxide Semiconductor), have less delay at a higher supply voltage than at a lower supply voltage. Therefore, operating the chip at as high a voltage as possible within the voltage range specified for the chip, without exceeding the limit temperature, reduces logic path delays and improves a timing margin on the semiconductor chip.

In an embodiment, a storage on the semiconductor chip holds product data that is used by the voltage controller. For example, the product data can be the low limit voltage for the semiconductor chip; the high limit voltage for the semiconductor chip; the limit temperature for the semiconductor chip; the predetermined time interval; data used by the voltage controller to change the predetermined time interval; and voltage step size information used by the voltage controller to determine by how much supply voltage should be changed at a particular time.

In a method embodiment of the invention, a timing margin of at least one path on the semiconductor chip is improved by performing the steps of operating the chip at a first voltage value supplied by the voltage regulator; detecting if a thermal fault exists; and changing the first voltage value to a second voltage value that is less than the first voltage value. If, however, a thermal fault does not occur within a predetermined interval of time, changing the first voltage value to a third voltage value that is higher than the first voltage value. The voltage values are not allowed to exceed the high limit voltage value or to decrease below the low limit voltage value. In an embodiment of the method, the high limit voltage, the low limit voltage, data related to setting the predetermined period of time, and other product data required for embodiments of the invention are read from a storage on the chip.

DETAILED DESCRIPTION OF THE PREFERRED EMBODIMENTS

The invention will be described in detail with reference to the figures. It will be appreciated that this description and these figures are for illustrative purposes only, and are not intended to limit the scope of the invention. In particular, various descriptions and illustrations of the applicability, use, and advantages of the invention are exemplary only, and do not define the scope of the invention. Accordingly, all questions of scope must be resolved only from claims set forth elsewhere in this disclosure.

The current invention teaches methods and apparatus to improve delay margins of logic paths on a semiconductor chip by dynamically controlling a supply voltage value coupled to the chip to be as high as possible within a voltage range without exceeding a limit temperature.

Figure 1A:
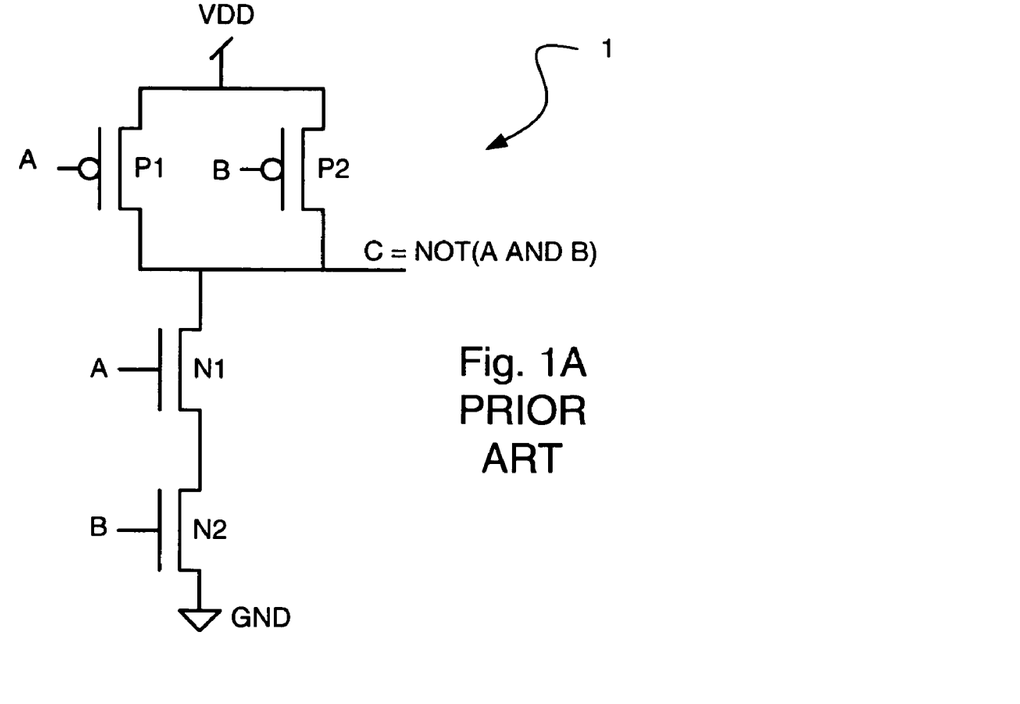
FIG. 1A is a prior art figure that shows an exemplary CMOS (Complementary Metal Oxide Semiconductor) two-input NAND circuit.

FIG. 1A shows a prior art CMOS NAND circuit, generally denoted as 1, for exemplary purposes. VDD is a supply voltage. Modern CMOS technology uses a VDD that is approximately 1 volt relative to ground (GND), however any voltage value is contemplated. CMOS circuits have the characteristic that they will typically operate over a relatively wide range of values of VDD. CMOS circuits have a maximum allowable voltage in any given process technology. Operation above the maximum allowable voltage will degrade or destroy the circuits. NFET devices suffer "hot electron" degradation at excessive voltages. PFET devices suffer "negative bias temperature instability" (NBTI) degradation when operated at excessive voltages.

Figure 1B:
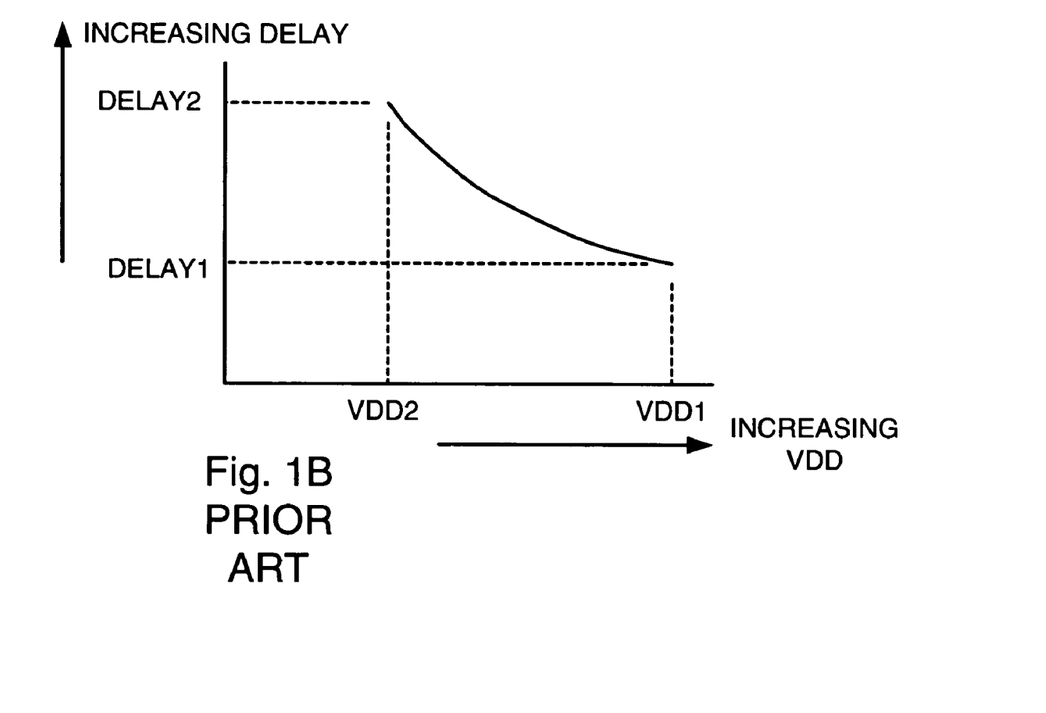
FIG. 1B is a prior art simplified drawing depicting how delay of the two-input NAND circuit of FIG. 1A varies with a supply voltage, VDD.
Figure 1C:
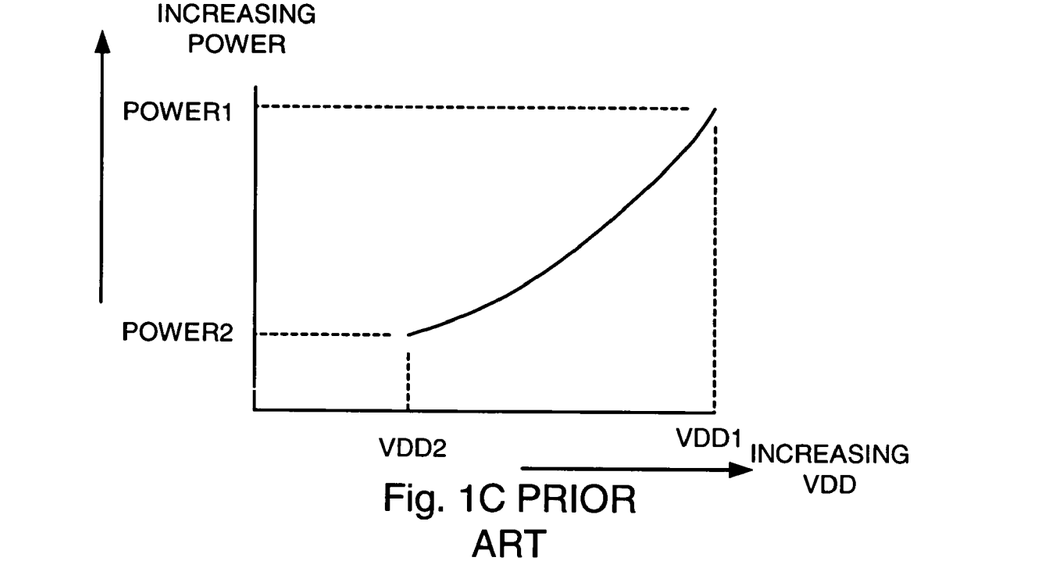
FIG. 1C is a prior art simplified drawing depicting how power of the two-input NAND circuit of FIG. 1A varies with the supply voltage, VDD.

The CMOS circuits also have a minimum allowable voltage in any given process technology and choice of CMOS circuitry. PFETs and NFETs have threshold values that must be exceeded to turn the devices on and place them in a conducting state. Beyond simple operation, however, the CMOS circuitry on a particular chip must operate at some predetermined speed, or frequency. As described earlier, and shown in exemplary prior art drawing FIG. 1B, in simplified graphical form, as VDD increases, delay of individual circuits, and, therefore, of paths comprising individual circuits decreases. The relationship is, within the range of operability, can be approximated as "N %" increase in VDD results in "X %" decrease in delay". FIG. 1C is an exemplary prior art drawing which shows that, in simplified, graphical form, power increases as supply voltage VDD increases. Both static power and dynamic power tend to increase as VDD increases. In the exemplary CMOS technology, a 1% change in VDD results in a 3% change in power. Chip temperature is related to chip power. Chip temperature is equal to the ambient temperature plus a "thermal resistance" times the chip power. In equation form:

Chip Temperature=Ambient Temperature+((thermal resistance) * (chip power))

The ambient temperature is the temperature of the substance, typically air, to which power dissipated in the chip is transferred. Thermal resistance is the ability of a material to transfer heat (power). Copper and aluminum are good conductors of heat and are therefore frequently used in heat sinks or other roles requiring low thermal resistance. Wood, insulating foam, and many other materials have relatively high thermal resistance, and are often used in roles requiring high thermal resistance, such as preventing escape of heat from homes. Semiconductor chips are typically mounted on plastic or ceramic modules. The modules are typically mounted on printed wiring boards (PWBs). Heat sinks and/or fans are frequently used to enhance heat transfer (i.e., lower thermal resistance) from the module to air. Many packaging techniques exist, and many techniques exist to enhance heat transfer. In general, calculation of an effective thermal resistance between the chip and the ambient is complex.

In addition, transient thermal behavior of the chip/module/heat sink (or other packaging technique) involves "thermal capacitance". A first material has an ability to absorb a unit of energy (i.e., a unit of power for a unit of time) and change temperature by a first amount, while a second material changes temperature by a second amount for the same unit of energy. Thermal capacitance and thermal resistance create a thermal time constant which is used to determine how rapidly an object (e.g., a semiconductor chip or a module) heats up from a lower temperature to a higher temperature, or cools down from a higher temperature to a lower temperature. For example, if a semiconductor chip is packaged in such a way as to have a low thermal capacitance and a high thermal resistance, the chip will heat up very quickly when the chip dissipates power.

Figure 1D:
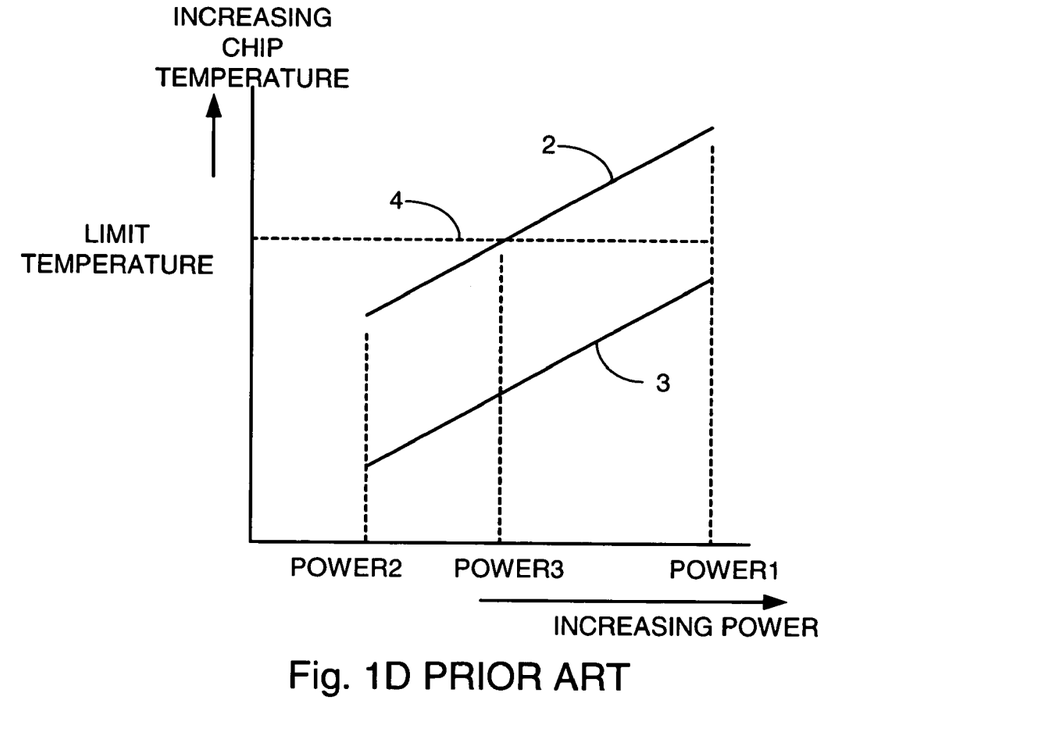
FIG. 1D is a prior art simplified drawing showing chip temperature versus power for two ambient conditions.

As stated earlier, temperature rise on a semiconductor chip is a function of power dissipated on the semiconductor chip and the thermal resistance (ignoring thermal transients associated with thermal capacitance). The temperature of the semiconductor chip is the sum of the temperature rise between the chip and the ambient plus the temperature of the ambient. FIG. 1D is a prior art chart showing a first chip temperature 2 and a second chip temperature 3 versus power dissipated. First chip temperature 2 is higher than second chip temperature 3 at a particular chip power only because first chip temperature 2 is for a chip operating in a higher ambient temperature. For example, a processor chip in a laptop computer will be cooler in a 70 degree Fahrenheit office environment than in a 120 degrees Fahrenheit warehouse environment.

A semiconductor chip is designed to reliably operate as long as the temperature on the chip does not exceed a maximum allowable temperature which is specified by the designer of the chip. The designer defines a limit temperature, equal to, or lower than, the maximum allowable temperature below which the chip should operate. Advantageously, the designer chooses a limit temperature enough below the maximum allowable temperature so that tolerances and rates of temperature increases can be accommodated while avoiding temperatures exceeding the maximum allowable temperature. FIG. 1D shows a dotted line indicating the limit temperature 4. Second chip temperature 3 never exceeds limit temperature 4 for the range of power shown (i.e., power2 to power1). However, first chip temperature 2 does exceed limit temperature 4 for a chip power intermediate between power2 and power1; e.g., power3 in FIG. 1D. At the ambient temperature of first chip temperature 2, action must be taken to ensure that chip temperature 2 does not exceed limit temperature 4.

Figure 2A:
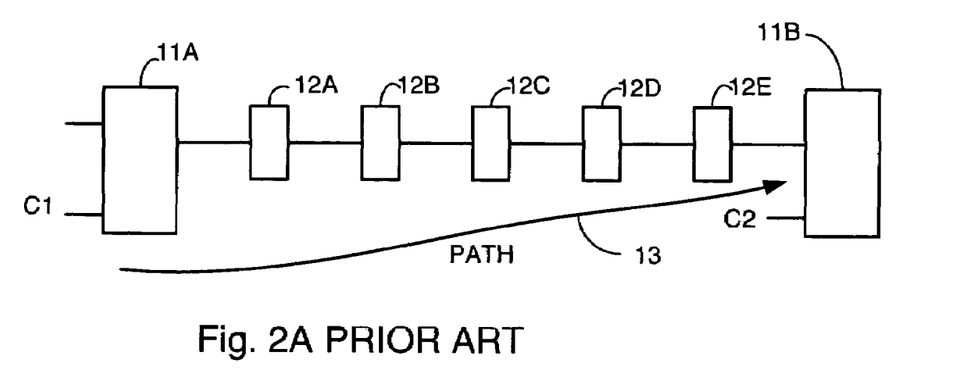
FIG. 2A is a prior art drawing that shows an exemplary path through a launch latch, a number of logic circuits, to a capture latch.

FIG. 2A is an exemplary prior art drawing that shows an exemplary logic path 13 on a semiconductor chip. A signal is launched from latch element 11A by an edge of clock C1. The signal propagates through logic blocks 12A-12E, and must arrive at latch element 11B in time to be captured by an edge of clock C2. For example, in a modern computer system having a clock cycle of 2 GHz, path 13 must be traversed in 500 picoseconds, minus margins for "setup/hold", clock tolerance, and other engineering considerations. A modern semiconductor chip comprises thousands, and even millions, of such paths, all of which must be traversed in time to be captured.

Figure 2B:
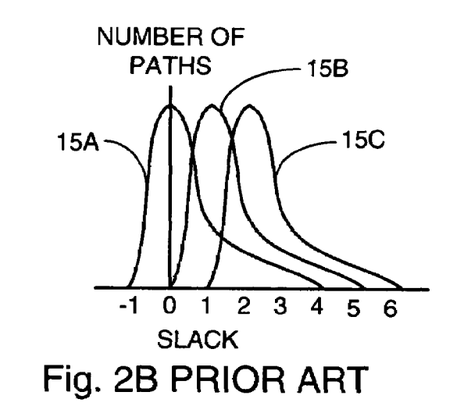
FIG. 2B is a prior art drawing that shows histograms of path delays on a semiconductor chip for three different values of the supply voltage, VDD.

Timing systems compute the delays of all logic blocks and determine timing margin, called "slack" on all relevant paths. A positive slack value indicates that a particular path can be traversed by a signal in time to be captured. A negative slack value indicates that a particular path can not be traversed by a signal in time to be captured. FIG. 2B is an exemplary prior art drawing that shows a histogram of all slacks on a semiconductor chip under three supply voltage conditions. Typically, the semiconductor chip is designed to operate at a particular temperature and voltage condition resulting in histogram 15B, using assumptions about the processing characteristics of a particular chip; typically "slow" process parameters (e.g., FET channel lengths, FET gate oxide thickness), however any assumptions regarding the processing characteristics of the particular chip are within the spirit and scope of the present invention. Histogram 15B has a few path slacks at or very near zero slack, and a large number of path slacks with only slightly positive slack. If voltage momentarily drops under a specified minimum voltage, the chip's slack histogram would momentarily shift to what is shown as histogram 15A, with negative slack on a number of paths. An electronic system will not reliably operate with negative slack on any path.

Furthermore, although histogram 15B shows no paths having negative slack, small process defects, such as imperfect vias, may exist undetected and introduce small delay increases that push a "small but positive" slack into the "negative" slack range, resulting in an unreliable electronic system.

Histogram 15C shows a histogram of path slacks shifted to the right, resulting in all paths having improved timing margin (i.e., additional positive slack). Such a shift can be accomplished by increasing the supply voltage, which can be safely done unless the semiconductor chip is operated in an environment having a temperature towards the top of the environmental temperature range in which the semiconductor chip is expected to operate, and, even then, the chip is likely to be able to operate without exceeding the limit temperature unless the chip is processed such that the FET devices are leaky. Typically, a chip with leaky FET devices is also a "fast" chip, with short FET channel lengths and/or thing FET gate oxides, in which case, timing margin can be improved by increasing the supply voltage, as with slower chips, by raising the supply voltage. However, because of their leaky characteristic which increases static power, the fast chip may not be able to be operated at the top of a voltage range specified for the chip without overheating the chip. This will be described in more detail later. For example, a semiconductor chip may be designed to operate in an environmental temperature range of 30 degrees Fahrenheit to 120 degrees Fahrenheit. In FIG. 1D, chip temperature 3 might correspond to the exemplary 30 degree Fahrenheit environmental temperature and chip temperature 2 might correspond to the exemplary 120 degree Fahrenheit environmental temperature. In practice, few, if any, semiconductor chips are actually operated at the maximum environmental temperature for which they are designed to operate. Also, most chips are not processed such that the maximum leakage in the FET devices occurs. Therefore, timing margin can be improved by raising the supply voltage in most cases.

The following description teaches apparatus and methods to increase timing margin of paths on a semiconductor chip, subject to thermal limitations. Although, for simplicity, fixed values are described for voltage and temperature limits, it will be understood that margins are contemplated. Preferably, the high limit voltage is defined to be at or near the maximum allowable voltage for the chip, although other values for the high limit voltage are within the spirit and scope of the invention.

Figure 3:
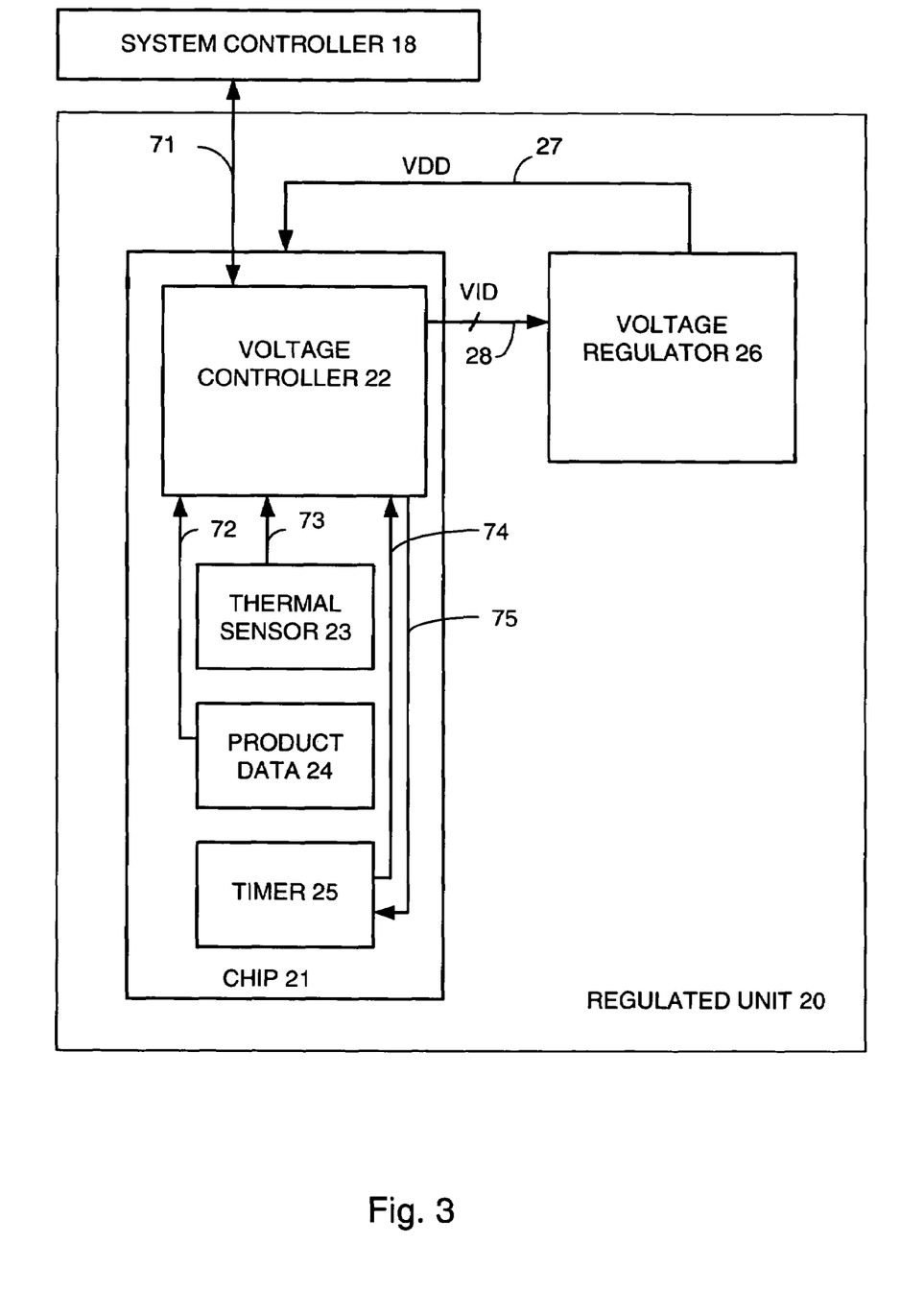
FIG. 3 shows a regulated unit according to an embodiment of the present invention.

FIG. 3 shows an exemplary embodiment of the invention. A regulated unit 20 comprises a chip 21 and a voltage regulator 26. Voltage regulator 26 supplies a voltage VDD 27 to chip 21 respondent to a value on a control signal, VID (voltage identifier) 28. VID 28 comprises a plurality of signal conductors carrying logical values (i.e., "1" or "0") driven by chip 21. Chip 21 further comprises a voltage controller 22 that determines what logical values to drive on VID 28 to improve a timing margin on a path on chip 21. It will be understood that although the regulated unit 20 shown in FIG. 3, and described below for exemplary purposes, shows a voltage regulator 26 separate from chip 21, using VID signals generated by the voltage controller 22 to control a supply voltage used by chip 21, there are many ways to regulate a supply voltage used by logic circuits on chip 21, including on-chip regulation. Furthermore, the control signal between the voltage controller 22 and the voltage regulator 28 need not be a VID coupling, but could be an analog voltage, or even a current. Any embodiment of a voltage controller working in concert with a voltage regulator to improve a timing margin of a path on a chip by raising a supply voltage as high as possible within a voltage range without causing the chip to operate at an excessive temperature is contemplated.

Voltage controller 22 is coupled to a thermal sensor 23 by coupling 23a. In an embodiment, thermal sensor 23 provides digital information on coupling 73, the digital information being indicative of a temperature on chip 21. In a second embodiment, thermal sensor 23 produces a voltage on coupling 73 indicative of the temperature on chip 21. In a third embodiment, thermal sensor 23 produces a current on coupling 73. In a fourth embodiment, thermal sensor 23 asserts a logical value on coupling 73 when the temperature on chip 21 exceeds a predetermined limit temperature. Voltage controller 22, in alternative embodiments, polls thermal sensor 23, or continuously monitors thermal sensor 23, for information indicative of the temperature on chip 21 exceeding the limit temperature.

Voltage controller 22 is coupled to a product data 24 using coupling 72, product data 24 constructed of storage on chip 21. Product data 24 stores chip information about chip 21 that is needed by voltage controller 22 to determine what logical values to drive on VID 28 to cause voltage regulator 26 to produce a voltage value on VDD 27 that improves a timing margin on a path on chip 21. Examples of chip information stored in product data 24 include, but are not limited to, limit temperature, high limit voltage, low limit voltage, timer initialization value or values, thermal data used by voltage controller 22 to determine a rate at which to change voltage; and thermal time constant information. In an embodiment, product data 24 is implemented in nonvolatile storage such as a fuse arrangement, a flash memory, an EEPROM (electrically erasable programmable read only memory), FERAM (ferroelectric random access memory), or other suitable nonvolatile storage. In a second embodiment, product data 24 is implemented in volatile storage, such as an SRAM or DRAM and is written to by a system controller 18 to be described shortly. Combinations of volatile storage and nonvolatile storage are contemplated for implementation of product data 24.

Voltage controller 22 is coupled to a timer 25 by couplings 74 and 75. Timer 25 is designed to be initialized, started, and to report to voltage controller 22 on coupling 74 upon elapse of a predetermined time interval. In a first embodiment, the timer is reset, or initialized, by voltage controller 22, using coupling 75, to a fixed value and counts to a second value that indicates the elapse of the predetermined time interval. For example, timer 25 may be a simple 16-bit counter that is initialized to "0". When timer 25 is started, it counts upward until the counter overflows; the overflow indicating that the predetermined interval (i.e., how long it takes to overflow a 16 bit counter at a particular clock frequency) has elapsed. Alternatively, timer 25 may be a 16-bit counter initialized to "1" but configured to count down, with the elapse of the predetermined time interval occurring when the counter is "0". In a more general case, timer 25 is programmable, allowing a first predetermined time interval to be used in a first situation, and a second predetermined time interval to be used in a second situation. In the more general case, the first predetermined time interval and the second predetermined time interval are programmed into timer 25 by voltage controller 22 using coupling 75.

Voltage controller 22, in an embodiment, is also in communication with system controller 18 using coupling 71. For example, in an IBM iSeries computer system, system controller 18 is a service processor. System controller 18 is capable of responding to system faults with appropriate actions, for examples, but not limited to, powering the regulated unit down, changing a clock frequency to the regulated unit, and alerting an operator.

Voltage controller 22 uses thermal sensor 23 for detection of a thermal fault; that is, detection that the temperature on chip 21 has exceeded the limit temperature. Upon detection of a thermal fault, voltage controller 22 changes the logical value driven on VID 28 to a value that will cause voltage regulator 26 to reduce the voltage on VDD 27. A reduced voltage on VDD 27 will result in less power dissipation on chip 21, and, therefore, a cooler temperature on chip 21. After a predetermined period of time, if the thermal fault persists, voltage controller 22 will again change the logical value driven on VID 28 to a value that will cause voltage regulator 26 to further reduce the voltage on VDD 27. As long as a thermal fault persists, voltage controller 22 will, after predetermined intervals of time, continue to change the logical value driven on VID 28 to cause voltage regulator 26 to reduce the voltage on VDD 27. However, if voltage controller 22 determines that further reduction of the voltage on VDD 27 would cause the voltage on VDD 27 to be less than the low limit voltage, Voltage controller 22 signals an uncorrectable thermal fault. In an embodiment including system controller 18, the uncorrectable thermal fault would be reported to system controller 18 on coupling 71. System controller 18 would then take predetermined action, such as shutting off regulated unit 20, reducing a frequency of a clock (not shown) input to chip 21, thereby degrading performance of chip 21 but reducing power dissipation, alerting an operator, or taking another predetermined action. In an embodiment lacking system controller 18, the determination that an uncorrectable thermal fault exists must be handled on the regulated unit itself, using predetermined actions similar to those taken by system controller 18, e.g., powering down the regulated unit, or degrading the performance of chip 21.

Voltage controller 22, at startup, in various embodiments, drives an initial value on VID 28 that will cause voltage regulator 26 to produce a voltage at or near the high limit voltage on VDD 27; the low limit voltage on VDD 27; or some intermediate voltage value on VDD 27. If the initial value driven on VID 28 by voltage controller 22 causes voltage regulator 26 to produce a first initial voltage on VDD 27 that is at or near the high limit voltage, that is, speculating that the environment is "cool", initial timing margins are maximized. If a thermal fault is detected while chip 21 is supplied with the first initial voltage, voltage controller 22 will change the logical value driven on VID 28, causing voltage regulator 26 to reduce the voltage on VDD 27. Voltage controller 22 will continue to effect reductions in VDD 27 by changing the logical value driven on VID 28 until no further thermal fault is detected. Advantageously, a first predetermined time interval that is relatively short, (e.g., on the order of a thermal time constant of chip 21 and its associated module) is used during a startup period when the first initial voltage on VDD 27 is set at or near the high limit voltage. As described earlier, the first predetermined time period can be permanently stored in a nonvolatile storage embodiment of product data 24, or, alternatively, received from system controller 18 and stored in a volatile storage embodiment of product data 24. The relatively short first predetermined time interval ensures that if a particular regulated unit 20 is powered up in an environment having a temperature at the top of the temperature range regulated unit 20 was designed to operate in, the voltage on VDD 27 will quickly be reduced, and chip 21 will not experience an excessive temperature.

In an alternate embodiment in which product data 24 contains thermal data (as described above) allowing voltage controller 22 to compute thermal time constants (or have thermal time constants directly stored in product data 24), and where thermal sensor 23 provides a digitized value for temperature, voltage controller 22 can, using a first temperature value measured before a first predetermined time interval and a second temperature value measured after the predetermined time interval to determine the rate of temperature increase. Voltage controller 22, knowing then the rate of increase of temperature, and the thermal time constant of the chip and package (from product data 24), can compute a final chip temperature (assuming chip power and ambient temperature were to stay constant). If the computed final chip temperature were to exceed the limit temperature, voltage controller 22 effects a reduction in VDD 27 voltage even before a thermal fault is detected. For example, if regulated unit 20 is powered up using a VDD 27 voltage at or near the high limit voltage (thus improving timing margins as much as possible), but in a hot environment, and/or chip 21 in the particular regulated unit 20 dissipates an unusually high amount of power (e.g., gate oxides are thin, causing a relatively high leakage current), chip temperature would quickly exceed the limit temperature. Voltage controller 22 responds to the fast temperature rise towards the limit temperature by making a relatively large change (reduction) in the VDD 27 voltage. Voltage controller 22, advantageously also uses a suitably short predetermined time interval after reducing the VDD 27 voltage to determine the effect in temperature rise rate of the voltage reduction.

Temperatures of the environment typically fluctuate over time. In addition, workload of an electronic system such as a computer system also tends to fluctuate over time. For example, a computer system used as a server may be heavily loaded during normal work hours, but underutilized during other times. Because of the lowered dynamic power in semiconductor chip (i.e., less switching activity), total power in chip 21 typically decreases as an electronic system utilization drops. Voltage controller 22 will periodically attempt to cause the voltage on VDD 27 to increase if no thermal fault is detected. The first predetermined time interval can be used as long as regulated unit 20 is operating. In an alternate embodiment, a second predetermined time interval is used following thermal transients following power on. Any number of predetermined time intervals are contemplated, a particular predetermined time interval being used by timer 25 as directed by voltage controller 22. In an embodiment, voltage controller 22 resets and starts timer 25. If no thermal fault has occurred by the time timer 25 reports the elapse of the particular time interval used in timer 25, voltage controller 22 changes the value driven onto VID 28 to a value that causes voltage regulator 26 to increase the voltage on VDD 27. Voltage controller 22 will not effect an increase of the voltage on VDD 27 that exceeds the high limit voltage.

Use of an initial voltage on VDD 27 that is at or near the low limit voltage is contemplated, wherein voltage controller 22 periodically (e.g., after elapse of a predetermined time period) effects increases in the voltage on VDD 27 until a thermal fault is detected. Voltage controller 22, upon detection of a thermal fault, then effects a reduction in the voltage on VDD 27 as described earlier. Since regulated unit 20 dynamically adjusts the voltage on VDD 27 to be as high as possible, subject to thermal faults and high limit voltage, the initial voltage can be set at any value within the voltage range defined by the low limit voltage and the high limit voltage. Thereafter, VDD 27 is increased or decreased as the environment or utilization of chip 21 changes, again subject to thermal faults, high limit voltage, and low limit voltage constraints.

Figure 4:
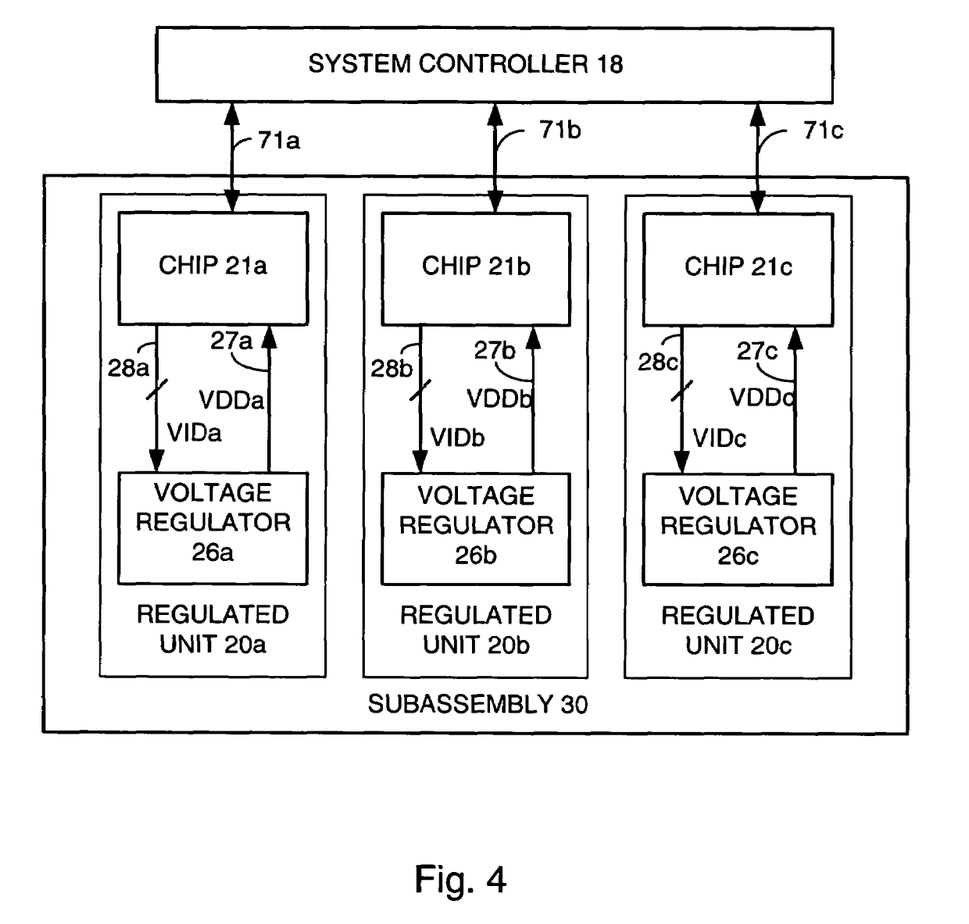
FIG. 4 shows a subassembly having three instances of the regulated unit of FIG. 3.

Many electronic systems comprise a subassembly having multiple chips. Advantageously, one or more of the chips on the subassembly have timing margins improved by embodiments of the present invention. FIG. 4 shows a subassembly 30 comprising three instances of regulated unit 20 of FIG. 3, shown as regulated units 20a, 20b, and 20c, which further comprise chips 21a, 21b, and 21c (which may all be the same chip type, e.g., all processor chips of the same part number, or may be different chip types), and voltage regulators 26a, 26b, and 26c. Chips 21a, 21b, and 21c drive VIDs 28a, 28b, and 28c, respectively to voltage regulators 26a, 26b, and 26c. Supply voltages VDDs 27a, 27b, and 27c are provided to chips 21a, 21b, and 21c. In an embodiment, chips 21a, 21b, and 21c are coupled by couplings 71a, 71b, and 71c, to system controller 18, which perform functions as described earlier. Subassembly 30, in various embodiments is a printed wiring board (PWB), a multi-chip module (MCM), or other packaging arrangement for regulated units.

Figure 5:
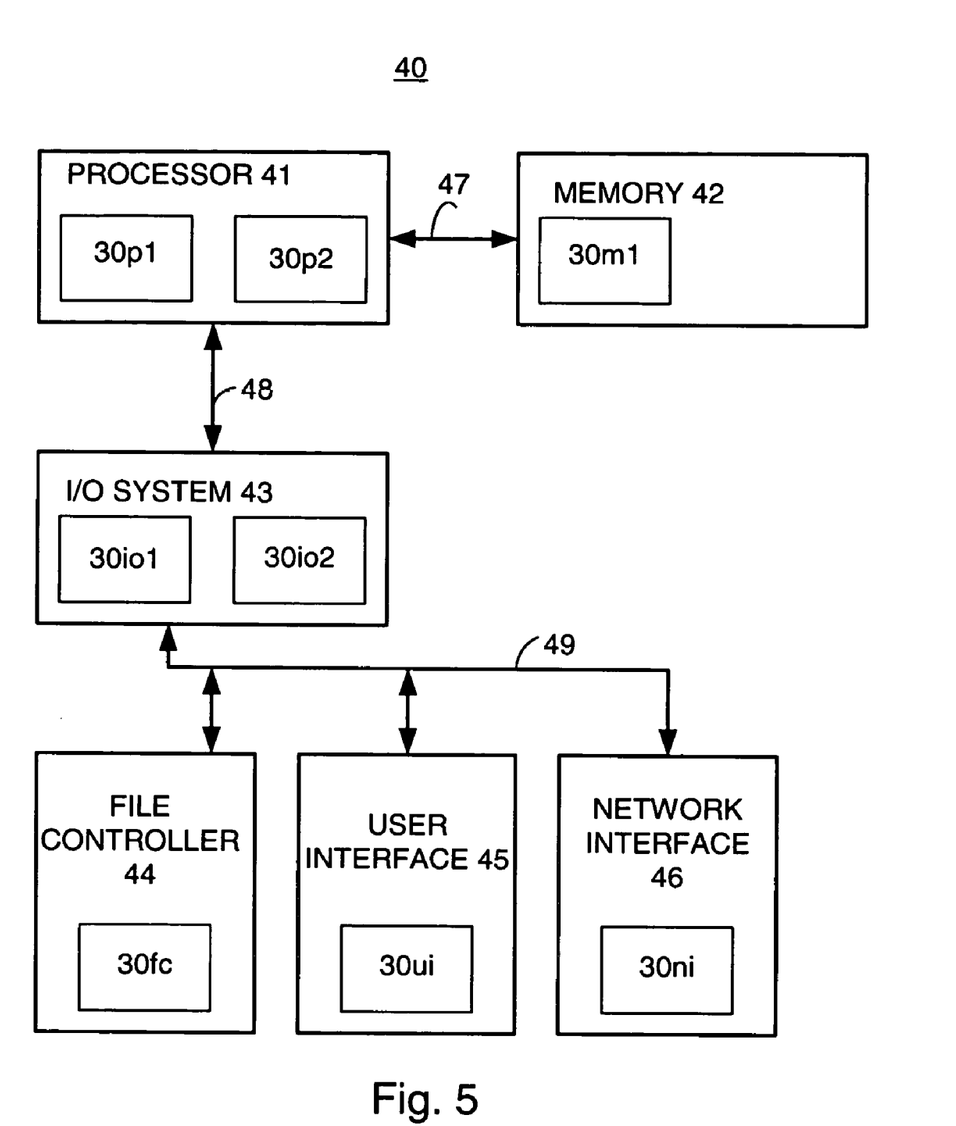
FIG. 5 shows a computer system having instances of the subassembly of FIG. 4 in various portions of the computer system.

A computer system comprises a number of system units, including, but limited to, a processor system unit, a memory system unit, an I/O system unit, a file controller unit, a user interface unit, and a network interface unit, each further comprising one or more subassemblies that further comprise one or more regulated units. FIG. 5 shows a block diagram of a computer system 40 comprising processor system unit 41 that further comprises subassemblies 30p1 and 30p2, which are processor instances of subassembly 30. Computer system 40 further comprises a memory system unit 42 that further comprises a memory subassembly 30m1 instance of subassembly 30. Computer system 40 further comprises an I/O system 43 that further comprises I/O system subassembly 30io1 and 30io2 instances of subassembly 30. Computer system 40 further comprises file controller system 44; user interface system 45; and network interface system 46; which further respectively comprise their subassemblies 30fc, 30ui, and 30ni as depicted in FIG. 5. At least one of the instances of subassemblies in FIG. 5 further comprise one or more regulated units as taught in FIG. 3 and the corresponding description given above.

Figure 6:
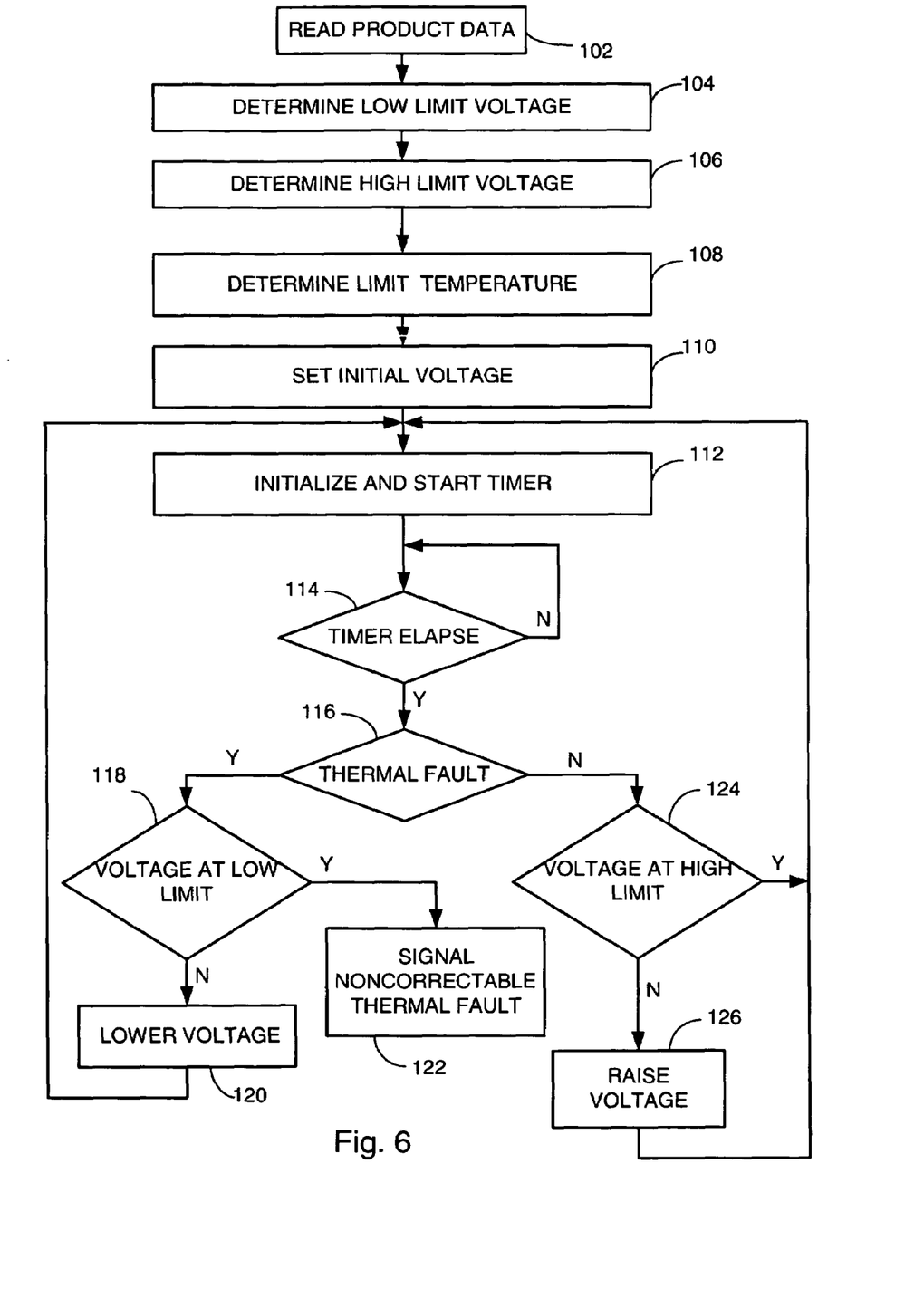
FIG. 6 is a flow chart of an embodiment of a method of the present invention.

An embodiment of the present invention is a method of improving timing margin of at least one path on a semiconductor chip coupled to a voltage supply, as shown in FIG. 6. In step 102, product data is read by a voltage controller. The product data includes, for example, but not limited to: a low limit voltage; a high limit voltage; a limit temperature; timer initialization value or values; information used by voltage controller 22 to determine a voltage step size; information used by controller 22 to determine a rate at which to change voltage; thermal time constant information; and information used to determine one or more predetermined timing intervals, are read from a storage. The storage is any means of storing information containing product data; for examples, but not limited to: nonvolatile storage such as fuses; flash memory; EEPROM; FERAM; volatile storage such as SRAM or DRAM; or combinations of volatile storage and nonvolatile storage. In the case of volatile storage, information must be transferred to the volatile storage during power on and bring up of an electronic system that comprises the semiconductor chip. In step 104, a low limit voltage is determined from the product data. Preferably, the low limit voltage is read directly from the product data; however, computation of the low limit voltage from performance-measured data is contemplated. For example, a PSRO (Performance Screen Ring Oscillator) frequency stored in the product data can be used to determine a low limit voltage at which the semiconductor chip will operate at a particular frequency. The frequency at which the chip is to operate also is part of the product data in various embodiments where the low limit voltage is determined from the particular frequency. It is to be understood that the low limit voltage may be in terms of volts, or, alternatively, in terms of a VID value (explained earlier), which, when applied to a suitable voltage regulator, will supply a low limit voltage. Any suitable means of describing a low limit voltage is within the spirit and scope of the present invention.

In step 106, a high limit voltage is determined, preferably read directly from the product data. The high limit voltage is typically, but not necessarily, chosen as the maximum voltage that the chip can operate at without suffering damage or degradation. As with the low limit voltage, it will be understood that the product data may define the high limit voltage in any suitable manner.

In step 108, limit temperature is determined from the product data. The limit temperature, in various embodiments, is in terms of degrees (Fahrenheit, Centigrade, Kelvin, etc.); in terms of a digital output of a digital temperature sensor not calibrated to any particular standard unit system; or an analog voltage (or analog current) output by an analog temperature sensor.

In step 110, the voltage controller effects an initial value on the supply voltage. Preferably, the initial supply voltage is controlled to be at or near (but not exceeding) the high limit voltage to the chip in order to attempt to maximize timing margin at startup. However, any initial supply voltage in the voltage range defined as being between the low limit voltage and the high limit voltage is within the scope and spirit of the invention.

In step 112, a timer is initialized and started. Upon elapse of a predetermined period of time measured by the timer, control passes to step 116 which checks to see if a thermal fault exists, that is, if the temperature of the semiconductor chip exceeds the limit temperature. If a thermal fault exists, control passes to step 118, which checks if further reduction of voltage would result in a supply voltage less than the low limit voltage. This can be done by an actual voltage measurement, comparison with a reference voltage, or by knowledge of the supply voltage output value of the voltage regulator voltage versus controller signal value driven to the voltage regulator. If the supply voltage can be lowered without falling below the low limit voltage, control passes to step 120; a control signal driven to the voltage regulator is changed to effect a decrease in the supply voltage, and control is passed to step 112. If step 118 determines that the supply voltage can not be lowered without falling below the low limit voltage, control passes to step 122, which signals an uncorrectable thermal fault. Control on the semiconductor chip may power down the chip, or take other action to prevent further operation at excessive chip temperature. Alternatively, in computer systems or other electronic systems, the uncorrectable thermal fault signal is driven to a separate controller, which determines how to handle the uncorrectable thermal fault.

If a thermal fault is not detected in step 116, control passes to step 124, which checks if the present supply voltage can be increased without exceeding the high limit voltage. If so, control passes to step 126, which effects an increase in the supply voltage, and control passes to step 112. If step 124 determines that the supply voltage can not be raised without exceeding the high limit voltage, control passes to step 112.

It will be understood by those skilled in the art that the method described above with reference to FIG. 6 can be implemented as a program product, that is, a set of computer executable instructions, that, when executed on a suitable computer, performs the steps described, to provide the increased timing margin on a regulated unit. The program product can be distributed on a computer readable media, such as, but not limited to, a floppy disk, a CDROM, a DVD ROM, or a magnetic tape. The program product can also be distributed using a network, such as, for example, the internet.

Figure 7:
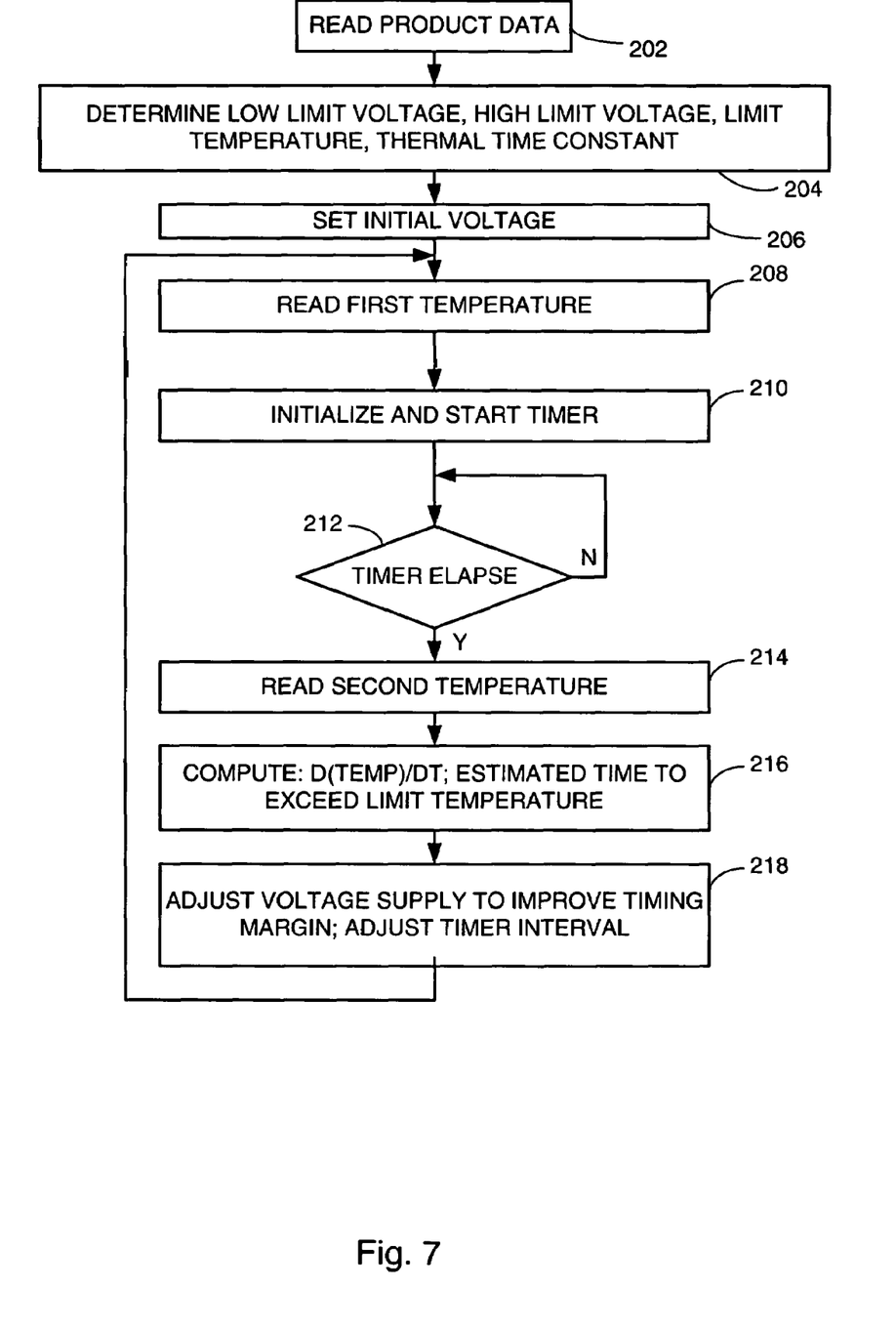
FIG. 7 is a flow chart of an embodiment of a method of the present invention in which rate of change of temperature is computed, and the rate of change is a determinant in making a supply voltage change.

FIG. 7 shows a second exemplary embodiment of the invention in which the voltage controller on the semiconductor chip has computational capability. Digital temperature values from the thermal sensor are read by the voltage controller. The voltage controller computes a change in temperature and causes the voltage regulator to make a change in voltage, as needed. As with the previous method of FIG. 6, the timing margin of at least one path on the chip is improved by operating at as high a voltage as possible in a voltage range between a low limit voltage and a high limit voltage, subject to not exceeding a limit temperature constraint. In step 202, product data is read from a storage. In step 204, at least a high limit voltage, a low limit voltage, and a limit temperature are determined from the product data. Other data, for examples, but not limited to: information about how voltage and power are related on the chip; and thermal time constant information are read, depending upon data required in a particular equation used in a later step. An initial time interval is stored in the product data if a timer coupled to the voltage controller is programmable.

In step 206, the voltage controller effects an initial voltage. The initial voltage is advantageously chosen to be at or near the high limit voltage in order to maximize the timing margins on the chip at startup. However, any initial voltage from the low limit voltage to the high limit voltage is contemplated. In step 208, the voltage controller reads a first temperature from the thermal sensor. In step 210, the timer is initialized and started. As described earlier, the timer may time a fixed time interval, or may be programmed to time different time intervals. Step 212 awaits elapse of the time interval. At the end of the time interval, in step 214 reads the current temperature. In step 216, the voltage controller uses the difference between the current temperature and the first temperature and the time interval to determine a rate of change of temperature, that is, $d(temp)/dt$. Knowing the limit temperature, the current temperature, and the rate of change of temperature, the voltage controller is able to compute a suitable voltage change and/or a time interval change.

For example, suppose the regulated unit is powered on with the voltage supply set at the high limit voltage, the regulated unit is in a hot environment, and the semiconductor chip, for reasons explained earlier is a high power chip, with FET gate oxides at the thin end of the semiconductor process and/or the FET channel lengths are at the short end of the process. The voltage controller computes a high rate of change in temperature, as well as a small difference between current temperature and the limit temperature. The voltage controller would effect a relatively large reduction in supply voltage. Advantageously, the voltage controller would also program the timer to use a shorter time interval in embodiments utilizing a programmable timer. In a second example, if there is a substantial difference between the limit temperature, and the rate of change of temperature is small (or negative), the voltage controller effects a large increase in supply voltage. The voltage supply must, of course, operate within the voltage range bounds of high limit voltage and low limit voltage. As in the method of FIG. 6, if temperature exceeds the limit temperature and the supply voltage is at the low limit voltage, some appropriate action must be taken, such as explained in reference to the method of FIG. 6.

In general, depending upon the particular packaging used, and knowledge of voltage versus power, a large variety of equations can be used, and the present invention contemplates any equation that seeks to improve timing margin by controlling a supply voltage as high as possible within a voltage range, given constraints of not exceeding the limit temperature. In step 218, the voltage controller adjusts the supply voltage according to the calculations done in step 216. If a timer interval change calculation was performed in step 216, the new time interval is provided for programming into the timer. Control is then passed to step 208. In an alternative embodiment of the method, where the calculations in step 216 can be done quickly relative to the rate of change in temperature, in step 218, the second temperature can simply replace the first temperature, and control can be passed to step 210 from step 218 instead of to step 208 from step 218.

It will be understood by those skilled in the art that the method described above with reference to FIG. 7 can be implemented as a program product, that is, a set of computer executable instructions, that, when executed on a suitable computer, performs the steps described, to provide the increased timing margin on a regulated unit. The program product can be distributed on a computer readable media, such as, but not limited to, a floppy disk, a CDROM, a DVD ROM, or a magnetic tape. The program product can also be distributed using a network, such as, for example, the internet.

What is claimed is:

1. A method of improving timing margin of at least one path on a semiconductor chip coupled to a voltage supply comprising the steps of:
    operating the semiconductor chip at a first voltage value of the voltage supply;
    detecting if a thermal fault exists;
    if a thermal fault is detected, lowering the voltage supply to a second voltage value lower than the first voltage value; and
    if, after elapse of a first predetermined time interval, a thermal fault is not detected, improving timing margin of at least one path on the semiconductor chip by performing the steps of:
        raising the voltage supply to a third voltage value higher than the first voltage value; and
        not changing a frequency of operation of the semiconductor chip.

2. The method of claim 1, further comprising the step of waiting for a subsequent elapse of a second predetermined time interval after lowering the voltage supply to the second voltage before again lowering the supply voltage.

3. The method of claim 1, further comprising the steps of
    determining a low limit voltage using performance data measured on the semiconductor chip, the low limit voltage being the lowest voltage at which the semiconductor chip will operate reliably at the frequency of operation;
    storing the low limit voltage as a portion of a product data in a storage on the semiconductor chip; and
    reading the product data on the semiconductor chip.

4. The method of claim 3, wherein if the second voltage value is less than the low limit voltage value a fault signal is activated indicating an uncorrectable thermal fault has occurred.

5. The method of claim 3, wherein the product data includes a high limit voltage value.

6. The method of claim 5, wherein if, after the predetermined elapsed time, a thermal fault is not detected, but the third voltage value cannot be increased without exceeding the high limit voltage value, the third voltage value is not changed.

7. The method of claim 1 further comprising the steps of
    determining a rate of change of temperature on the semiconductor chip;
    determining a difference between a current voltage value and the high limit voltage; and
    changing the first predetermined time interval to a second predetermined time interval responsive to the rate of change of temperature on the semiconductor chip and the difference between the current voltage value and the high limit voltage.

8. A program product comprising computer readable instructions, distributed on a computer readable media, that, when executed on a suitable computer, performs the steps of the method of claim 1.

* * * * *